United States Patent
Kim

(10) Patent No.: US 11,888,018 B2
(45) Date of Patent: Jan. 30, 2024

(54) SEMICONDUCTOR DEVICE AND METHOD FOR FABRICATING THE SAME

(71) Applicant: SK hynix Inc., Gyeonggi-do (KR)

(72) Inventor: Seung-Muk Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 390 days.

(21) Appl. No.: 17/208,393

(22) Filed: Mar. 22, 2021

(65) Prior Publication Data

US 2021/0210593 A1 Jul. 8, 2021

Related U.S. Application Data

(63) Continuation of application No. 16/677,868, filed on Nov. 8, 2019, now Pat. No. 10,985,238.

(30) Foreign Application Priority Data

Mar. 29, 2019 (KR) .......................... 10-2019-0037176

(51) Int. Cl.
*H01L 49/02* (2006.01)
*H01L 21/311* (2006.01)

(52) U.S. Cl.
CPC ........ *H01L 28/40* (2013.01); *H01L 21/31144* (2013.01)

(58) Field of Classification Search
CPC ...................................... H01L 28/40
See application file for complete search history.

(56) References Cited

U.S. PATENT DOCUMENTS

| | | | |
|---|---|---|---|
| 8,969,167 B2 * | 3/2015 | Yoon ....................... | H01L 28/40 |
| | | | 438/381 |
| 9,159,729 B2 * | 10/2015 | Kim ..................... | H10B 12/318 |
| 9,412,749 B1 | 8/2016 | Shimabukuro et al. | |
| 10,249,706 B1 * | 4/2019 | Chang ................ | H10B 12/0335 |
| 2006/0199368 A1 | 9/2006 | Engelhardt et al. | |
| 2011/0304008 A1 | 12/2011 | Yang | |
| 2012/0056298 A1 | 3/2012 | Kuroki | |
| 2012/0112317 A1 | 5/2012 | Kang et al. | |
| 2014/0061736 A1 | 3/2014 | Hwang et al. | |
| 2017/0077102 A1 | 3/2017 | Kim et al. | |

(Continued)

FOREIGN PATENT DOCUMENTS

| | | |
|---|---|---|
| CN | 101241899 A | 8/2008 |
| CN | 103390541 A | 11/2013 |
| CN | 108335980 A | 7/2018 |

(Continued)

OTHER PUBLICATIONS

Office Action for the Chinese Patent Application No. 201911249262.0 issued by the Chinese Patent Office dated Oct. 27, 2023.

*Primary Examiner* — Peniel M Gumedzoe
(74) *Attorney, Agent, or Firm* — IP & T GROUP LLP

(57) ABSTRACT

A capacitor includes a plurality of lower bottom electrodes, a lower supporter supporting the lower bottom electrodes and including a plurality of lower supporter openings, upper bottom electrodes formed on the lower bottom electrodes, respectively, and an upper supporter supporting the upper bottom electrodes and including a plurality of upper supporter openings, wherein the lower supporter openings and the upper supporter openings do not vertically overlap each other.

9 Claims, 17 Drawing Sheets

(56) References Cited

U.S. PATENT DOCUMENTS

2018/0158829 A1    6/2018  Song et al.
2020/0006345 A1*  1/2020  Choo .................. H10B 12/033

FOREIGN PATENT DOCUMENTS

| CN | 109256370 A | 1/2019 |
|----|-------------|--------|
| JP | 2011054676 A | 3/2011 |
| JP | 2011108823 A | 6/2011 |

* cited by examiner

SEMICONDUCTOR DEVICE AND METHOD FOR FABRICATING THE SAME

CROSS-REFERENCE TO RELATED APPLICATIONS

This application is a continuation of U.S. patent application Ser. No. 16/677,868 filed on Nov. 8, 2019, which claims benefits of priority of Korean Patent Application No. 10-2019-0037176 filed on Mar. 29, 2019. The disclosure of each of the foregoing application is incorporated herein by reference in its entirety.

BACKGROUND

1. Field

Various embodiments of the present disclosure relate to a semiconductor device, and more particularly, to a semiconductor device including a capacitor and a method for fabricating the semiconductor device.

2. Description of the Related Art

As the degree of integration of a semiconductor device increases, a capacitor with sufficient capacitance within a limited area is required. The capacitance of the capacitor is proportional to the surface area of an electrode and the dielectric constant of a dielectric material, and inversely proportional to the equivalent oxide thickness of the dielectric material. Examples of a method for increasing the capacitance of the capacitor within the limited area may include a method of increasing the surface area of the electrode by forming a capacitor having a three-dimensional structure, a method of reducing the equivalent oxide thickness of the dielectric material or a method of using a high-k dielectric material.

SUMMARY

Various embodiments are directed to a semiconductor device including a capacitor whose reliability is improved, and a method for fabricating the semiconductor device.

In accordance with an embodiment of the present invention, a capacitor includes: a plurality of lower bottom electrodes; a lower supporter supporting the lower bottom electrodes and including a plurality of lower supporter openings; upper bottom electrodes formed on the lower bottom electrodes, respectively; and an upper supporter supporting the upper bottom electrodes and including a plurality of upper supporter openings, wherein the lower supporter openings and the upper supporter openings do not vertically overlap each other.

In accordance with an embodiment, a method for fabricating a capacitor includes: forming a lower capacitor module over a semiconductor substrate, the lower capacitor module including a plurality of lower bottom electrodes and a lower supporter having a plurality of lower supporter openings that partially expose some of the lower bottom electrodes; and forming a upper capacitor module on the lower capacitor module, the upper capacitor module including a plurality of upper bottom electrodes and an upper supporter having a plurality of upper supporter openings that partially expose some of the upper bottom electrodes, wherein the lower supporter openings and the upper supporter openings do not vertically overlap each other.

These and other features and advantages of the present invention will become apparent to those skilled in the art of the invention from the following detailed description in conjunction with the following drawings.

DETAILED DESCRIPTION

Figure 1A:
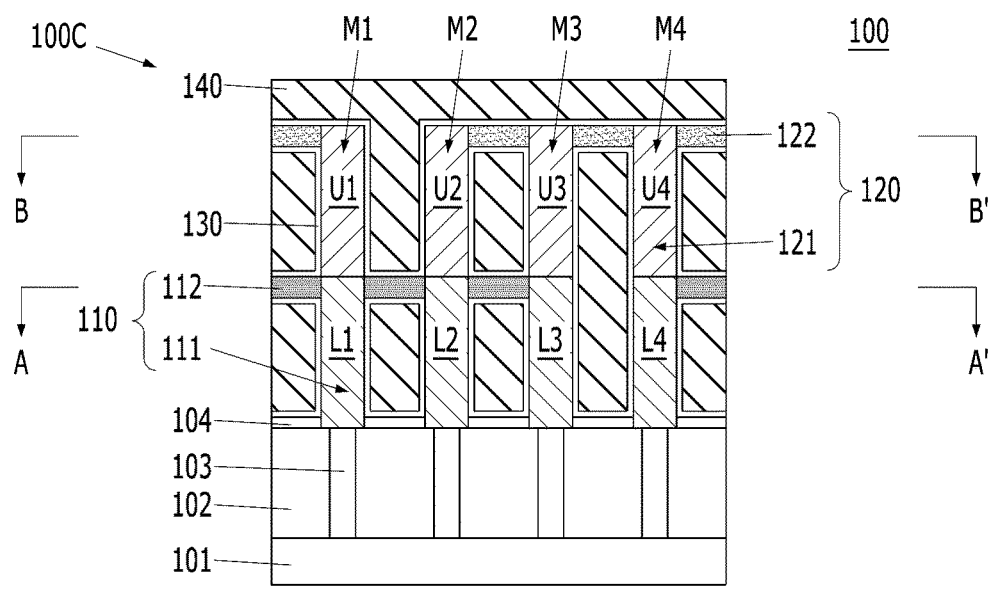
FIG. 1A is a cross-sectional view illustrating a semiconductor device in accordance with an embodiment of the present invention.

Various embodiments of the present disclosure described herein will be described with reference to cross-sectional views, plane views and block diagrams, which are ideal schematic views of the present invention. Thus, the structures of the drawings may be modified by fabricating techniques and/or tolerances. The embodiments of the present invention are not limited to the specific structures shown in drawings, but include any changes in the structures that may be produced according to the fabricating process. Accordingly, the regions illustrated in the drawings have schematic attributes, and the shapes of the regions illustrated in the drawings are intended to illustrate specific structures of regions of the elements, and are not intended to limit the scope of the invention.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

In the embodiments described below, when a capacitor having a high aspect ratio is formed, the capacitor may be formed for each module in order to enhance resistance to bending of a bottom electrode. Herein, the process of forming the capacitor for each module may include a plurality of capacitor modules. For example, the plurality of capacitor modules may include a lower capacitor module and an upper capacitor module. The upper capacitor module may be formed after the lower capacitor module is formed in advance. Each of the bottom and upper capacitor modules may include bottom electrodes and a supporter, and a top electrode may be shared by the bottom and upper capacitor modules.

Since the capacitor is formed for each module as described above, the bending of the bottom electrode can be reduced, and thus the characteristics and yield of the capacitor can be improved.

Figure 1B:
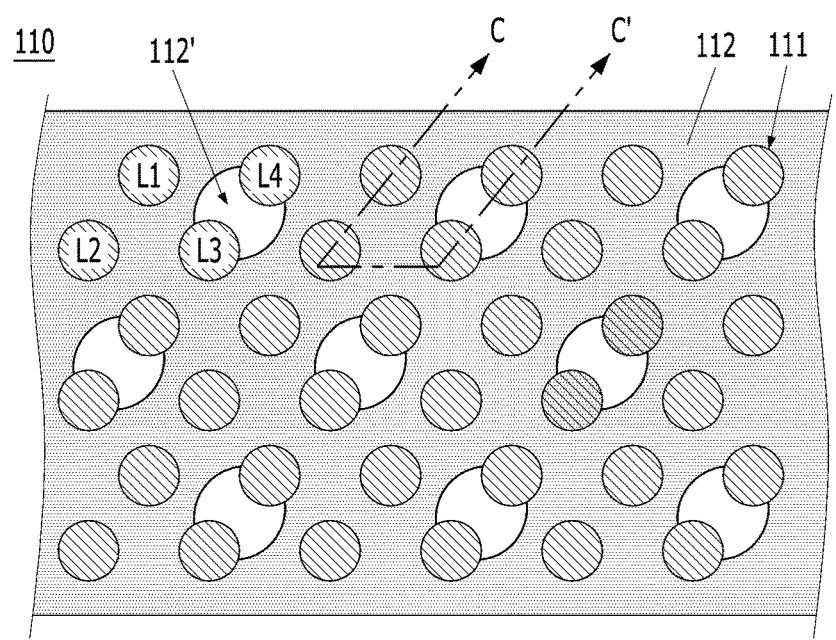
FIG. 1B is a plan view illustrating lower bottom electrodes and a lower supporter of a lower capacitor module shown in FIG. 1A.
Figure 1C:
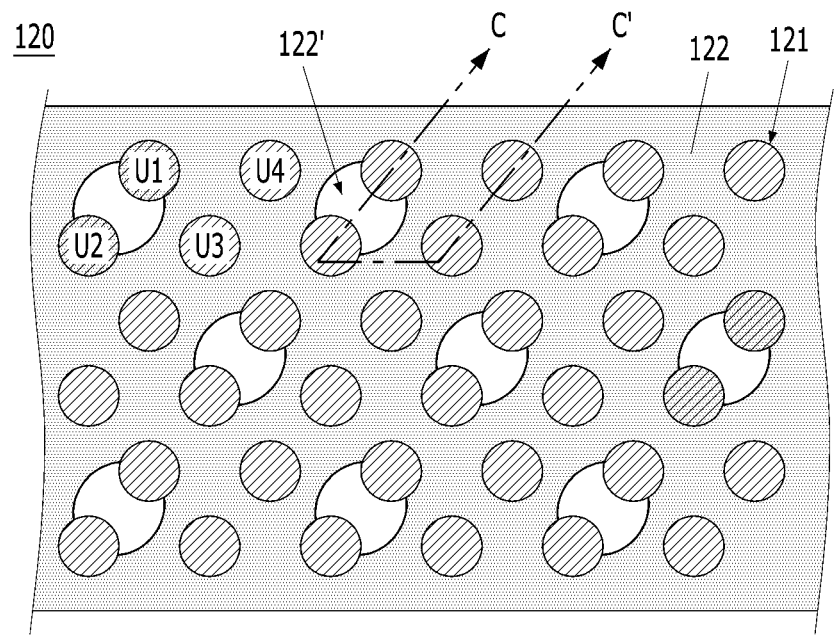
FIG. 1C is a plan view illustrating upper bottom electrodes and an upper supporter of an upper capacitor module shown in FIG. 1A.

FIG. 1A is a cross-sectional view illustrating a semiconductor device 100 in accordance with an embodiment of the present invention. FIG. 1B is a plan view illustrating lower bottom electrodes 111 and a lower supporter 112 of a lower capacitor module 110, taken along an A-A' line shown in FIG. 1A. FIG. 1C is a plan view illustrating upper bottom electrodes 121 and an upper supporter 122 of an upper capacitor module 120, taken along a B-B' line shown in FIG. 1A. Referring to FIGS. 1A to 1C, the semiconductor device 100 may include a capacitor 100C. The capacitor 100C may include a lower capacitor module 110 and an upper capacitor module 120. The upper capacitor module 120 disposed on the lower capacitor module 110. The lower capacitor module 110 and the upper capacitor module 120 may be vertically connected to each other. The vertical connection between the lower capacitor module 110 and the upper capacitor module 120 may be an electrical connection.

The semiconductor device 100 may further include a semiconductor substrate 101 and an interlayer dielectric layer 102 formed on the semiconductor substrate 101. A plurality of storage node contact plugs 103 may be formed penetrating through the interlayer dielectric layer 102. The plurality of storage node contact plugs 103 may be spaced apart at a regular interval.

The lower capacitor module 110 may include an array of lower bottom electrodes 111 and a lower supporter 112. The array of lower bottom electrodes 111 and the lower supporter 112 may also be referred to as a lower bottom electrode module. The lower capacitor module 110 may further include a dielectric layer 130 and a top electrode 140. The dielectric layer 130 may cover the outer wall of the lower bottom electrodes 111 and the surface of the lower supporter 112. The array of lower bottom electrodes 111 may include a plurality of spaced apart lower bottom electrodes 111. The number of the lower bottom electrodes 111 may correspond to the number of the storage node contact plugs 103. Each of the lower bottom electrodes 111 may be formed on a respective storage node contact plug 103. Each of the lower bottom electrodes 111 may have a larger cross-sectional area than a respective storage node contact plug 103 on which it stands. Each of the lower bottom electrodes 111 may be formed also on a small area of a top surface of the interlayer dielectric layer 102 surrounding a respective one of the storage node contact plugs 103. A portion of the top surface of the interlayer dielectric layer 102 may not be covered by the lower bottom electrodes 111. An etch stop layer 104 may cover the portion of the top surface of the interlayer dielectric layer 102 not covered by the lower bottom electrodes 111. A top surface of the lower supporter 112 may be at the same level with top surfaces of each of the plurality the lower bottom electrodes 111.

The upper capacitor module 120 may include an array of upper bottom electrodes 121 and an upper supporter 122. The array of upper bottom electrodes 121 and the upper supporter 122 may also be referred to as an upper bottom electrode module. The array of upper bottom electrodes 121 may include a plurality of upper bottom electrodes 121 which are spaced apart at a regular interval. The lower bottom electrodes 111 and the upper bottom electrodes 121 may be vertically coupled to each other. The number of the plurality of the upper bottom electrodes 121 may be equal to the number of the plurality of the lower bottom electrodes 111 and may be disposed at the same positions as respective lower bottom electrodes L1-L4. The upper bottom electrodes 121 and their corresponding lower bottom electrodes 111 may be concentric elongated elements and may have the same cross-sectional areas. The plurality of the upper bottom electrodes 121 may be vertically coupled to and aligned with respective ones of the plurality of the lower bottom electrodes 111. The upper capacitor module 120 may further include the dielectric layer 130 and a top electrode 140. The dielectric layer 130 may cover the outer wall of each of the upper bottom electrodes 121. The dielectric layer 130 may also cover the top and bottom surface of the upper supporter 112.

The lower capacitor module 110 and the upper capacitor module 120 may share the dielectric layer 130 and the top electrode 140. The dielectric layer 130 and the top electrode 140 may be formed by a single process, which is to be described below.

The lower bottom electrodes 111 and the upper bottom electrodes 121 may be made of the same material or different materials. The lower bottom electrodes 111 and the upper bottom electrodes 121 may include a metal-containing material. The lower bottom electrodes 111 and the upper bottom electrodes 121 may include a metal, metal nitride, conductive metal oxide or combinations thereof. The lower bottom electrodes 111 and the upper bottom electrodes 121 may be made of titanium (Ti), titanium nitride (TiN), tantalum nitride (TaN), tungsten (W), tungsten nitride (WN), ruthenium (Ru), iridium (Ir), ruthenium oxide (RuO$_2$), iridium oxide (IrO$_2$) or combinations thereof. In some embodiments, the lower bottom electrodes 111 and the upper bottom electrodes 121 may include a silicon-containing material. The lower bottom electrodes 111 and the upper bottom electrodes 121 may include a silicon layer, a silicon germanium layer or a combination thereof.

The dielectric layer 130 may have a single-layer structure, or a multilayer structure. In an embodiment, the dielectric layer 130 may be a laminate structure. The dielectric layer 130 may be contacted with the lower bottom electrodes 111 and the upper bottom electrodes 121. The dielectric layer 130 may include a high-k material, i.e., a material having a higher dielectric constant than the dielectric constant of silicon oxide (SiO$_2$) which is of approximately 3.9. For example, the dielectric layer 130 may include a material having a dielectric constant of approximately 4 or higher In an embodiment, the dielectric layer 130 may include a material having a dielectric constant of approximately 20 or higher. The high-k material may include hafnium oxide (HfO$_2$), zirconium oxide (ZrO$_2$), aluminum oxide (Al$_2$O$_3$), titanium oxide (TiO$_2$), tantalum oxide (Ta$_2$O$_5$), niobium oxide (Nb$_2$O$_5$) or strontium titanium oxide (SrTiO$_3$). In some embodiments, the dielectric layer 130 may be a composite layer including two or more of the above-described high-k materials. The dielectric layer 130 may be formed of zirconium (Zr)-based oxide. The dielectric layer 130 may have a multilayer structure including zirconium oxide ($ZrO_2$). The dielectric layer 130 may include a ZAZ ($ZrO_2/Al_2O_3/ZrO_2$) structure in which zirconium oxide, aluminum oxide and zirconium oxide are sequentially stacked. The ZAZ structure may also be referred to as a "zirconium oxide ($ZrO_2$)-based layer". In some embodiments, the dielectric layer 130 may be formed of hafnium (Hf)-based oxide. The dielectric layer 130 may have a multilayer structure including hafnium oxide ($HfO_2$). For example, the dielectric layer 130 may include a HAH ($HfO_2/Al_2O_3/HfO_2$) structure in which hafnium oxide, aluminum oxide and hafnium oxide are sequentially stacked. The HAH structure may also be referred to as a "hafnium oxide ($HfO_2$)-based layer".

The aluminum oxide ($Al_2O_3$) in the ZAZ and HAH structures has a higher bandgap than the zirconium oxide ($ZrO_2$) and the hafnium oxide ($HfO_2$). Also, the aluminum oxide ($Al_2O_3$) has a lower dielectric constant than the zirconium oxide ($ZrO_2$) and the hafnium oxide ($HfO_2$). Accordingly, the dielectric layer 130 may include a stack of a high-k material and a high bandgap material having a higher bandgap than the high-k material. The dielectric layer 130 may include silicon oxide $SiO_2$ as a high bandgap material other than aluminum oxide. The dielectric layer 130 including a high bandgap material may suppress a leakage.

In some embodiments, the dielectric layer 130 may include aluminum-doped zirconium oxide (Al-doped $ZrO_2$) or aluminum-doped hafnium oxide (Al-doped $HfO_2$). The dielectric layer 130 may include a ZAZZ ($ZrO_2$/Al-doped $ZrO_2/ZrO_2$) or HAHH ($HfO_2$/Al-dope $HfO_2/HfO_2$) structure. The ZAZZ ($ZrO_2$/Al-doped $ZrO_2/ZrO_2$) structure may be a stack in which aluminum-doped zirconium oxide is disposed between zirconium oxides. The HAHH ($HfO_2$/Al-dope $HfO_2/HfO_2$) structure may be a stack in which aluminum-doped hafnium oxide is disposed between hafnium oxides.

In some embodiments, the dielectric layer 130 may include a laminate structure such as a ZAZA ($ZrO_2/Al_2O_3/ZrO_2/Al_2O_3$) or HAHA ($HfO_2/Al_2O_3/HfO_2/Al_2O_3$) structure.

The top electrode 140 may include a metal-containing material. The top electrode 140 may include a metal, metal nitride, conductive metal nitride or combinations thereof. The top electrode 140 may be made of titanium (Ti), titanium nitride (TiN), tantalum nitride (TaN), tungsten (W), tungsten nitride (WN), ruthenium, iridium, ruthenium oxide, iridium oxide or combinations thereof. In some embodiments, the top electrode 140 may include a stack of silicon germanium and a metal-containing material.

The lower bottom electrodes 111 may electrically contact the storage node contact plugs 103 penetrate through the etch stop layer 104. The upper bottom electrodes 121 may be directly contacted with the lower bottom electrode array 111.

In the lower capacitor module 110, a plurality of lower bottom electrodes 111 may be supported by the lower supporter 112. In the upper capacitor module 120, a plurality of upper bottom electrodes 121 may be supported by the upper supporter 122. The lower and upper supporters 112 and 122 may be made, for example, of silicon nitride or silicon carbon nitride (SiCN).

As will be described below, the lower capacitor module 110 and the upper capacitor module 120 may be formed on a module basis. On a module basis, as this term is used herein, may mean that the lower capacitor module 110 including the lower bottom electrodes 111 and the lower supporter 112 is formed first, and then, after the formation of the lower capacitor module 110 is completed, formation of the upper capacitor module 120 including the upper bottom electrodes 121 and the upper supporter 122 may be performed.

The lower bottom electrodes 111 and the upper bottom electrodes 121 may have pillar shapes, respectively.

The lower bottom electrodes 111 may be arranged in a zigzag array. Likewise, the plurality of the upper bottom electrodes 121 may also be arranged in a zigzag array.

The lower supporter 112 and the upper supporter 122 may have different shapes. The lower supporter 112 may include a plurality of lower supporter openings 112'. The upper supporter 122 may include a plurality of upper supporter openings 122'. The lower supporter openings 112' and the upper supporter openings 122' may not vertically overlap each other. For example, the lower supporter openings 112' and the upper supporter openings 122' may be arranged in the zigzag array so that the lower supporter openings 112' and the upper supporter openings 122' may not vertically overlap each other.

The lower supporter openings 112' and the upper supporter openings 122', which are opened by etching the lower supporter 112 and the upper supporter 122, respectively, may each be patterned in the zigzag array at the time of forming the lower capacitor module 110 and the upper capacitor module 120, respectively. Each of the lower supporter openings 112' may have a shape to expose a space between two neighboring lower bottom electrodes 111. Each of the upper supporter openings 122' may have a shape to expose a space between two neighboring upper bottom electrodes 121.

The lower bottom electrodes 111 and the upper bottom electrodes 121 may be vertically stacked. The stack structure of the lower bottom electrodes 111 and the upper bottom electrodes 121 may be referred to as a "modular bottom electrode".

The lower bottom electrodes 111 may include first and second lower bottom electrodes L1 and L2 that are surrounded by the lower supporter 112 and third and fourth lower bottom electrodes L3 and L4 whose outer walls are partially exposed through the lower supporter opening 112'.

The upper bottom electrodes 121 may include first and second upper bottom electrodes U1 and U2 whose outer walls are partially exposed through the upper supporter opening 122' and third and fourth upper bottom electrodes U3 and U4 that are surrounded by the upper supporter 122. Since the outer walls of the first and second lower bottom electrodes L1 and L2 are fully supported by the lower supporter 112, the first and second lower bottom electrodes L1 and L2 may be referred to as "fully-supported lower bottom electrodes". Since the outer walls of the third and fourth lower bottom electrodes L3 and L4 are partially supported by the lower supporter 112, the third and fourth lower bottom electrodes L3 and L4 may be referred to as "partially-supported lower bottom electrodes". Herein, the wording "fully supported" indicates that the upper outer walls of the first and second lower bottom electrodes L1 and L2 are covered by the lower supporter 112. The wording "partially-supported" indicates that the upper outer walls of the third and fourth lower bottom electrodes L3 and L4 are partially covered by the lower supporter 112.

Since the upper outer walls of the first and second upper bottom electrodes U1 and U2 are partially supported by the upper supporter 122, the first and second upper bottom electrodes U1 and U2 may be referred to as "partially-supported upper bottom electrodes". Since the upper outer walls of the third and fourth upper bottom electrodes U3 and U4 are fully supported by the upper supporter 122, the third and fourth upper bottom electrodes U3 and U4 may be referred to as "fully-supported upper bottom electrodes".

The first lower bottom electrode L1 and the first upper bottom electrode U1 may be vertically stacked, the upper outer wall of the first lower bottom electrode L1 may be fully supported by the lower supporter 112, and the upper outer wall of the first upper bottom electrode U1 may be partially supported by the upper supporter 122. The stacked structure of the first lower bottom electrode L1 and the first upper bottom electrode U1 may be referred to as a first modular bottom electrode M1.

The second lower bottom electrode L2 and the second upper bottom electrode U2 may be vertically stacked, the upper outer wall of the second lower bottom electrode L2 may be fully supported by the lower supporter 112, and the upper outer wall of the second upper bottom electrode U2 may be partially supported by the upper supporter 122. The stacked structure of the second lower bottom electrode L2 and the second upper bottom electrode U2 may be referred to as a second modular bottom electrode M2.

The third lower bottom electrode L3 and the third upper bottom electrode U3 may be vertically stacked, the upper outer wall of the third lower bottom electrode L3 may be partially supported by the lower supporter 112, and the upper outer wall of the third upper bottom electrode U3 may be fully supported by the upper supporter 122. The stacked structure of the third lower bottom electrode L3 and the third upper bottom electrode U3 may be a third modular bottom electrode M3.

The fourth lower bottom electrode L4 and the fourth upper bottom electrode U4 may be vertically stacked, the upper outer wall of the fourth lower bottom electrode L4 may be partially supported by the lower supporter 112, and the upper outer wall of the fourth upper bottom electrode U4 may be fully supported by the upper supporter 122. The stacked structure of the fourth lower bottom electrode L4 and the fourth upper bottom electrode U4 may be a fourth modular bottom electrode M4.

The first and second modular bottom electrodes M1 and M2 may be partially supported by the upper supporter 122 while fully supported by the lower supporter 112. The third and fourth modular bottom electrodes M3 and M4 may be fully supported by the upper supporter 122 while partially supported by the lower supporter 112.

According to the above-described structure, the lower capacitor module 110 and the upper capacitor module 120 may be separately formed. Thus, the capacitor module 100C having a high aspect ratio may be formed with enhanced structural integrity because bending of the modular bottom electrodes M1, M2, M3 and M4 may be substantially reduced or prevented.

In addition, since the lower supporter openings 112' and the upper supporter openings 122' are formed separately, it is possible to increase open areas of the supporter openings. When the open areas of the supporter openings are increased, the capacitance of the capacitor module 100C may also increase.

FIGS. 2A to 2J are cross-sectional views illustrating a method for fabricating a semiconductor device in accordance with an embodiment of the present invention. FIGS. 2A to 2J are the cross-sectional views illustrating the method for fabricating the semiconductor device, taken along C-C' lines shown in FIGS. 1B and 1C.

Figure 2A:
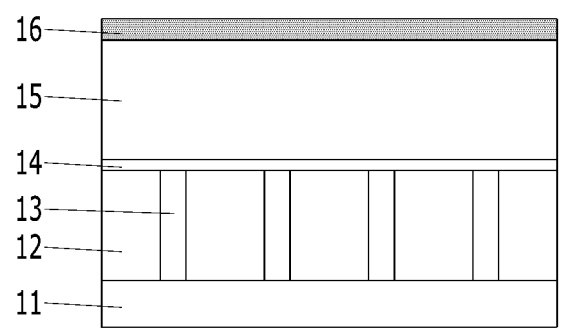
FIGS. 2A to 2J are cross-sectional views illustrating a method for fabricating a semiconductor device in accordance with an embodiment of the present invention.

Referring to FIG. 2A, an interlayer dielectric layer 12 may be formed on a semiconductor substrate 11. A plurality of storage node contact plugs 13 may be formed to be spaced apart at a regular interval in the interlayer dielectric layer 12.

The storage node contact plugs 13 may each be coupled to the semiconductor substrate 11 by penetrating through the interlayer dielectric layer 12. The storage node contact plugs 13 may include a silicon plug, a metal plug or a combination thereof. Although not illustrated, buried word lines may be formed in the semiconductor substrate 11. Before the storage node contact plugs 13 are formed, a plurality of bit lines (not illustrated) may be further formed.

The semiconductor substrate 11 may be a material that is suitable for semiconductor processing. The semiconductor substrate 11 may be formed of a silicon-containing material. The semiconductor substrate 11 may include silicon, monocrystalline silicon, polysilicon, amorphous silicon, silicon germanium, monocrystalline silicon germanium, polycrystalline silicon germanium, carbon-doped silicon, combinations thereof or multi-layers thereof. The semiconductor substrate 11 may include another semiconductor material, such as germanium. The semiconductor substrate 11 may include an III/V-group semiconductor substrate, for example, a chemical compound semiconductor substrate such as a gallium arsenide (GaAs). The semiconductor substrate 11 may include a Silicon-On-Insulator (SOI) substrate.

The interlayer dielectric layer 12 may be formed of high-density plasma oxide (HDP oxide), TetraEthylOrthoSilicate (TEOS), Plasma Enhanced TetraEthylOrthoSilicate (PE-TEOS), O3-Tetra Ethyl Ortho Silicate ($O_3$-TEOS), an undoped Silicate Glass (USG), a PhosphoSilicate Glass (PSG), a BoroSilicate Glass (BSG), a BoroPhosphoSilicate Glass (BPSG), a Fluoride Silicate Glass (FSG), a Spin on Glass (SOG), Tonen SilaZene (TOSZ) or combinations thereof. In addition, the interlayer dielectric layer 12 may be formed of silicon nitride, silicon oxynitride or a low-k material having a low dielectric constant.

A mold structure may be formed on the storage node contact plugs 13 and the interlayer dielectric layer 12. The mold structure may include a stack of an etch stop layer 14, a first mold layer 15 and a lower supporter layer 16 sequentially formed.

The first mold layer 15 may be, for example, silicon oxide ($SiO_2$). The first mold layer 15 may be formed to have a larger thickness (dimension measured in the stacking direction) than the lower supporter layer 16. For example, in an embodiment, the first mold layer 15 may be at least 2 to 4 times larger in thickness than the lower supporter layer 16. The first mold layer 15 may be formed using a deposition process such as chemical vapor deposition (CVD) or physical vapor deposition (PVD).

The etch stop layer 14 may be formed of a material having an etch selectivity to the interlayer dielectric layer 12 and the first mold layer 15. The etch stop layer 14 may include silicon nitride or silicon oxynitride.

The lower supporter layer 16 may be formed of a material having an etch selectivity to the first mold layer 15. The lower supporter layer 16 may include silicon nitride or silicon carbon nitride (SiCN).

Figure 2B:
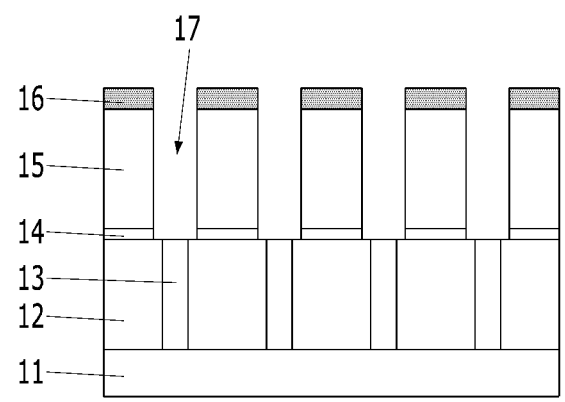

Referring to FIG. 2B, a plurality of lower openings 17 may be formed. The lower openings 17 may be formed by etching the mold structure using a mask layer (not illustrated). The lower supporter layer 16 and the first mold layer 15 may be sequentially etched using the mask layer as an etch barrier, in order to form the lower openings 17. The etch process for forming the lower openings 17 may be stopped at the etch stop layer 14. A dry etch process, a wet etch process or a combination thereof may be used to form the lower openings 17. Each of the lower openings 17 may be referred to as a hole in which a bottom electrode or a storage node is to be formed. Each of the lower openings 17 may have an aspect ratio of at least 1:1 or greater. For example, each of the lower openings 17 may have a high aspect ratio of at least 10:1 or greater.

Subsequently, the etch stop layer 14 below the lower openings 17 may be etched to expose the top surfaces of the storage node contact plugs 13.

A lower mold structure pattern including the plurality of lower openings 17 may be formed by the above-described series of etch processes. The lower mold structure pattern may be a stacked layer of the etch stop layer 14, the first mold layer 15 and the lower supporter layer 16.

Figure 2C:
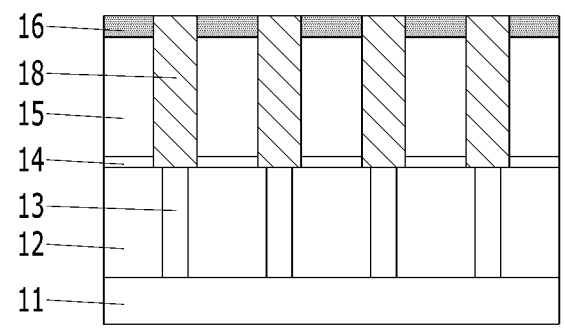

Referring to FIG. 2C, lower bottom electrodes 18 may be formed in each of the lower openings 17. Each of the lower bottom electrodes 18 may fill the inside of a corresponding lower opening 17. Each of the lower bottom electrodes 18 may have a pillar shape. In order to form the lower bottom electrodes 18 having the pillar shape, a conductive material may be deposited to gap-fill the lower openings 17 and then planarized. The lower bottom electrodes 18 may be made of or include polysilicon, a metal, metal nitride, conductive metal oxide, metal silicide, a noble metal or combinations thereof. The lower bottom electrodes 18 may be made of or include one or more of titanium (Ti), titanium nitride (TiN), tantalum (Ta), tantalum nitride (TaN), titanium aluminum nitride (TiAlN), tungsten (W) or tungsten nitride (WN), ruthenium (Ru), ruthenium oxide ($RuO_2$), iridium (Ir), iridium oxide ($IrO_2$), platinum (Pt) and combinations thereof. In the present embodiment, the lower bottom electrodes 18 may be made of titanium nitride (TiN). The lower bottom electrodes 18 may be made of titanium nitride (ALD-TiN) formed by atomic layer deposition (ALD).

In some embodiments, the lower bottom electrodes 18 may include a stacked structure of titanium nitride and tungsten. In some embodiments, the lower bottom electrodes 18 may include a stacked structure of titanium nitride and polysilicon.

Figure 2D:
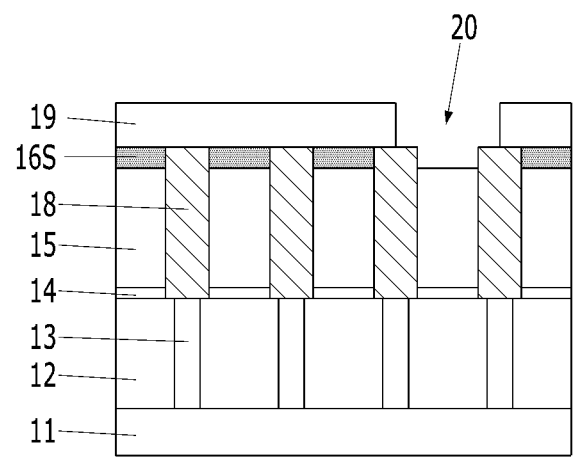

Referring to FIG. 2D, a lower supporter mask layer 19 may be formed. For example, the lower supporter mask layer 19 may be formed of any suitable photoresist or amorphous carbon.

Subsequently, a portion of the lower supporter layer 16 may be etched using the lower supporter mask layer 19. A lower supporter opening 20 and a lower supporter 16S may be formed by the etching of the lower supporter layer 16. The lower supporter opening 20 may correspond to the lower supporter opening 112' of FIG. 1B.

The lower supporter 16S may contact the upper sidewall of each of the lower bottom electrodes 18. A portion of the top surface of the first mold layer 15 may be exposed by the lower supporter opening 20. The lower supporter 16S may surround a portion of the outer wall of the lower bottom electrodes 18. The lower supporter 16S may prevent the lower bottom electrodes 18 from collapsing in a subsequent process of removing the first mold layer 15.

Figure 2E:
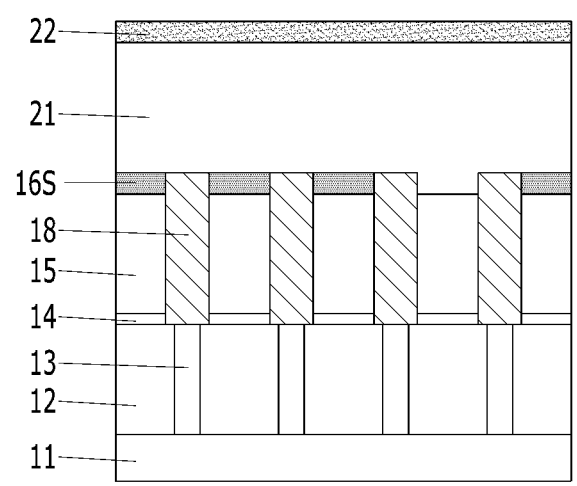

Referring to FIG. 2E, the lower supporter mask layer 19 may be removed.

Continuously, a second mold layer 21 and an upper supporter layer 22 may be sequentially formed on the lower supporter 16S and the lower bottom electrodes 18. The second mold layer 21 may be formed of the same material as the first mold layer 15. The second mold layer 21 may be formed to have a larger thickness than the upper supporter layer 22. For example, the second mold layer 21 may be at least 2 to 4 times larger in thickness than the upper supporter layer 22. The second mold layer 21 may be formed using the deposition process such as CVD or PVD.

The upper supporter layer 22 may be formed of a material having an etch selectivity to the second mold layer 21. The upper supporter layer 22 may include silicon nitride or silicon carbon nitride (SiCN). The lower supporter 16S and the upper supporter layer 22 may be made of the same material.

Figure 2F:
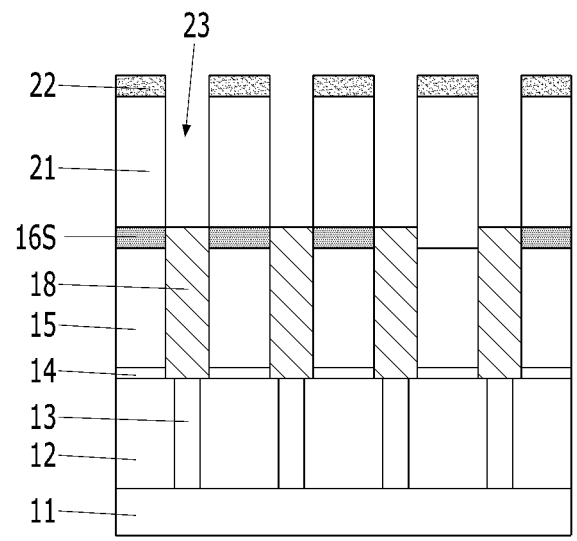

Referring to FIG. 2F, a plurality of top openings 23 may be formed. The top openings 23 may be formed by an etch process using a mask layer (not illustrated). The upper supporter layer 22 and the second mold layer 21 may be sequentially etched using the mask layer as an etch barrier, in order to form the top openings 23. The etch process for forming the top openings 23 may be stopped at the lower bottom electrodes 18. A dry etch process, a wet etch process or a combination thereof may be used to form the top openings 23.

Each of the top openings 23 may be landed on a respective one of the lower bottom electrodes 18. The top openings 23 may correspond in number with the lower bottom electrodes 18 and may be formed to be aligned in one to one correspondence with the lower bottom electrodes 18, and expose the surfaces of the lower bottom electrodes 18, respectively. Some of the top openings 23 may expose the lower bottom electrodes 18 contacted with the lower supporter 16S. The other top openings 23 may expose the lower bottom electrodes 18 which are not contacted with the lower supporter 16S. Herein, the lower bottom electrodes 18 which are not contacted with the lower supporter 16S may refer to the lower bottom electrodes 18 that are not supported by the lower supporter 16S.

Figure 2G:
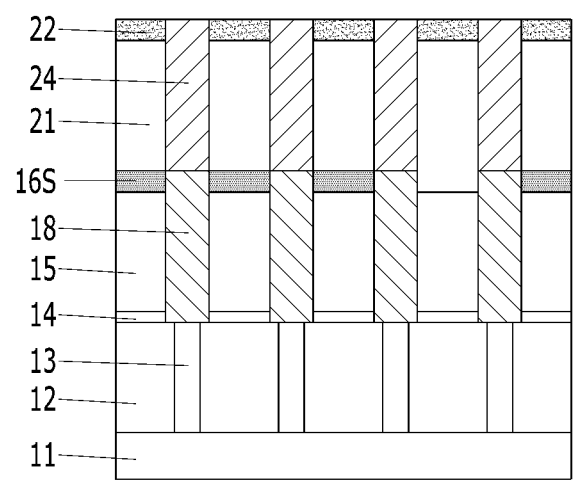

Referring to FIG. 2G, upper bottom electrodes 24 may be formed in each of the top openings 23. Each of the upper bottom electrodes 24 may fill the inside of each of the top openings 23. The upper bottom electrodes 24 may each have a pillar shape. In order to form the upper bottom electrodes 24 having the pillar shape, a conductive material may be deposited to gap-fill the top openings 23 and then planarized. The upper bottom electrode 24 may be made of or include polysilicon, a metal, metal nitride, conductive metal oxide, metal silicide, a noble metal or combinations thereof. The upper bottom electrode 24 may be made of or include one or more of titanium (Ti), titanium nitride (TiN), tantalum (Ta), tantalum nitride (TaN), titanium aluminum nitride (TiAlN), tungsten (W) or tungsten nitride (WN), ruthenium (Ru), ruthenium oxide ($RuO_2$), iridium (Ir), iridium oxide ($IrO_2$), platinum (Pt) and combinations thereof. In the present embodiment, the upper bottom electrode 24 may be made of titanium nitride (TiN). The upper bottom electrode 24 may be made of titanium nitride (ALD-TiN) formed by atomic layer deposition (ALD).

In some embodiments, the upper bottom electrodes 24 may include a stacked structure of titanium nitride and tungsten. In some embodiments, the upper bottom electrodes 24 may include a stacked structure of titanium nitride and polysilicon.

The lower bottom electrodes 18 and the upper bottom electrodes 24 may be made of the same material or different materials.

Figure 2H:
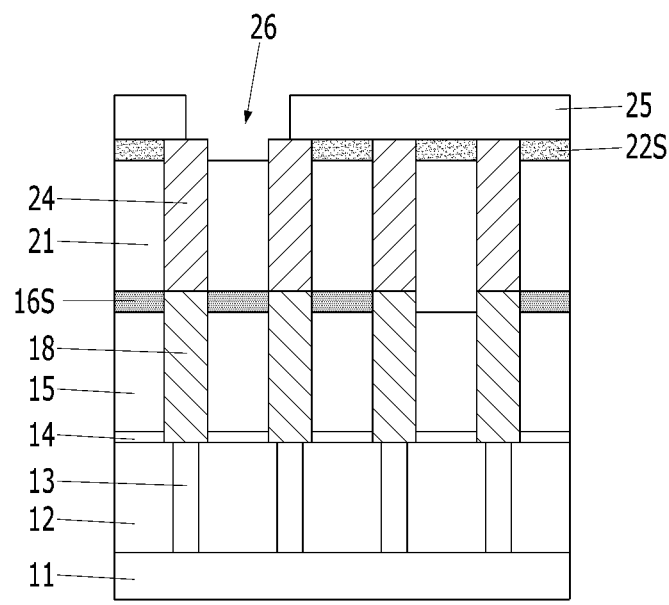

Referring to FIG. 2H, an upper supporter mask layer 25 may be formed. For example, the upper supporter mask layer 25 may be formed of any suitable photoresist or amorphous carbon.

Subsequently, a portion of the upper supporter layer 22 may be etched using the upper supporter mask layer 25 as an etch barrier. An upper supporter opening 26 and an upper supporter 22S may be formed by the etching of the upper supporter layer 22. The upper supporter opening 26 may correspond to the upper supporter opening 122' of FIG. 1C. The upper supporter opening 26 and the lower supporter opening 20 of FIG. 2D may not vertically overlap each other.

The upper supporter 22S may contact the upper sidewalls of each of the upper bottom electrodes 24. The surfaces of some of the second mold layers 21 may be exposed by the upper supporter 22S. The upper supporter 22S may have a shape to surround portions of the outer walls of the upper bottom electrodes 24. The upper supporter 22S may prevent the upper bottom electrodes 24 from collapsing in a subsequent process of removing the second mold layer 21.

Figure 2I:
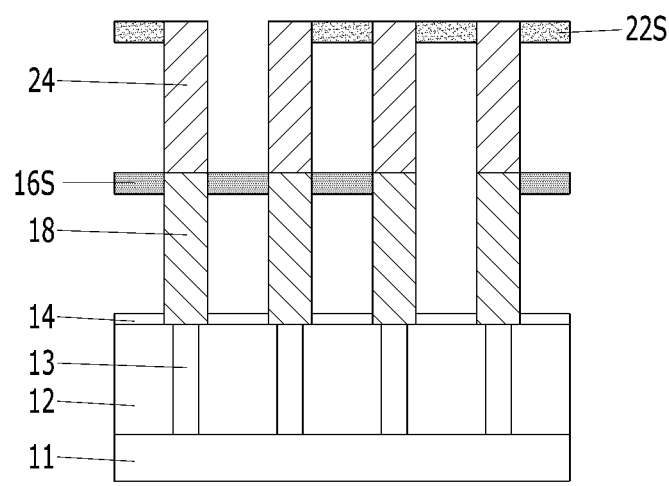

Referring to FIG. 2I, the second mold layer 21 and the first mold layer 15 may be removed. For example, the first and second mold layers 15 and 21 may be removed by a wet dip-out process. A wet chemical for removing the first and second mold layers 15 and 21 may be supplied through the upper supporter opening 26 of FIG. 2H. One or more of chemicals which may be used as a wet chemical include chemicals such as HF, $NH_4F/NH_4OH$, $H_2O_2$, HCl, $HNO_3$ and $H_2SO_4$.

For example, the first and second mold layers 15 and 21 may be formed of silicon oxide, and the first and second mold layers 15 and 21 may be removed by the wet deep-out process using hydrofluoric acid (HF) or a chemical including hydrofluoric acid (HF). When the first and second mold layers 15 and 21 are removed, the lower and upper supporters 16S and 22S each having an etch selectivity to the first and second mold layers 15 and 21 may not be removed but remain. Accordingly, since the adjacent lower bottom electrodes 18 are supported by the lower supporter 16S, the lower bottom electrodes 18 may be prevented from bending or collapsing. In addition, since the adjacent upper bottom electrodes 24 are supported by the upper supporter 22S, the upper bottom electrodes 24 may be prevented from collapsing or bending.

During the removal of the first and second mold layers 15 and 21, the etch stop layer 14 may prevent the storage node contact plugs 13 from being damaged.

Figure 2J:
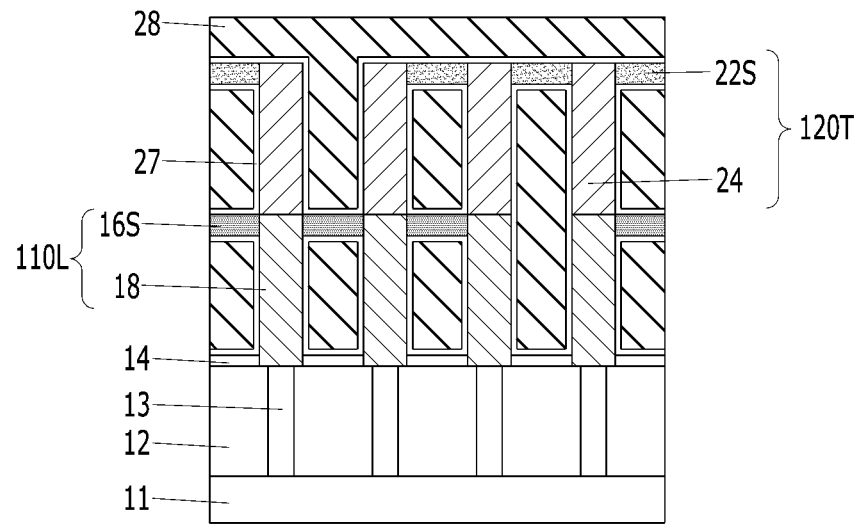

Referring to FIG. 2J, a dielectric layer 27 may be formed. The dielectric layer 27 may be formed on the lower bottom electrodes 18 and upper bottom electrodes 24 and the lower and upper supporters 16S and 22S. A portion of the dielectric layer 27 may cover the etch stop layer 14. The dielectric layer 27 may include a high-k material. Examples of suitable high-k materials may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$) or strontium titanium oxide ($SrTiO_3$). In some embodiments, the dielectric layer 27 may be formed of a composite layer including two or more layers of the high-k material described above.

In the present embodiment, the dielectric layer 27 may be formed of a zirconium oxide-based material which has good leakage current characteristics while sufficiently lowering the equivalent oxide layer thickness (EOT). For example, the dielectric layer 27 may include a ZAZ ($ZrO_2/Al_2O_3/ZrO_2$) structure. In some embodiments, the dielectric layer 27 may include an HAH ($HfO_2/Al_2O_3/HfO_2$) structure.

In some embodiments, the dielectric layer 27 may include a TZAZ ($TiO_2/ZrO_2/Al_2O_3/ZrO_2$), TZAZT ($TiO_2/ZrO_2/Al_2O_3/ZrO_2/TiO_2$), ZAZT ($ZrO_2/Al_2O_3/ZrO_2/TiO_2$), TZ ($TiO_2/ZrO_2$) or ZAZAT ($ZrO_2/Al_2O_3/ZrO_2/Al_2O_3/TiO_2$) structure. In dielectric layer stacks such as the TZAZ, TZAZT, ZAZT, TZ and ZAZAT structures, $TiO_2$ may be replaced by $Ta_2O_5$.

The dielectric layer 27 may be formed using chemical vapor deposition (CVD) or atomic layer deposition (ALD) with excellent step coverage.

Subsequently, a top electrode 28 may be formed on the dielectric layer 27. The top electrode 28 may fill a gap between the adjacent upper bottom electrodes 24, and also fill a gap between the adjacent lower bottom electrodes 18. The top electrode 28 may include a stack of a silicon-containing material and a metal-containing material. The silicon-containing material of the top electrode 28 may include silicon germanium, and the top electrode 28 may be gap-filled by the silicon germanium without a void between the lower bottom electrodes 18 and the upper bottom electrodes 24. The top electrode 28 may further include the metal-containing material on the silicon germanium. The metal-containing material may include a metal, metal nitride, conductive metal nitride or combinations thereof. The metal-containing material may be made of titanium (Ti), titanium nitride (TiN), tantalum nitride (TaN), tungsten (W), tungsten nitride (WN), ruthenium (Ru), iridium (Ir), ruthenium oxide ($RuO_2$), iridium oxide ($IrO_2$) or combinations thereof. The metal-containing material may serve to lower the resistance of the top electrode 28.

The top electrode 28 may be formed using low pressure chemical vapor deposition (LPCVD), plasma enhanced chemical vapor deposition (PECVD) or atomic layer deposition (ALD).

According to the above description, a lower capacitor module 110L may be formed, and a upper capacitor module 120T may be formed on the lower capacitor module 110L. The lower capacitor module 110L may include the lower supporter 16S and the plurality of lower bottom electrodes 18. The upper capacitor module 120T may include the top supporter 22S and the plurality of upper bottom electrodes 24. The lower supporter 16S may fully supports some of the lower bottom electrodes 18, and partially support the other lower bottom electrodes 18. The upper supporter 22S may fully supports some of the upper bottom electrodes 24, and partially supports the other upper bottom electrodes 24.

Figure 3:
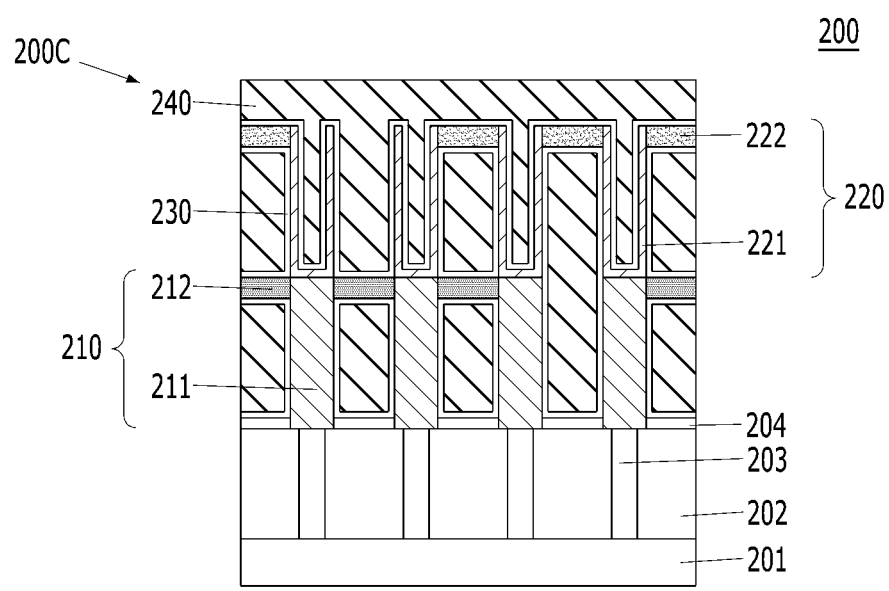
FIGS. 3 to 5 are cross-sectional views illustrating semiconductor devices in accordance with various embodiments.
Figure 4:
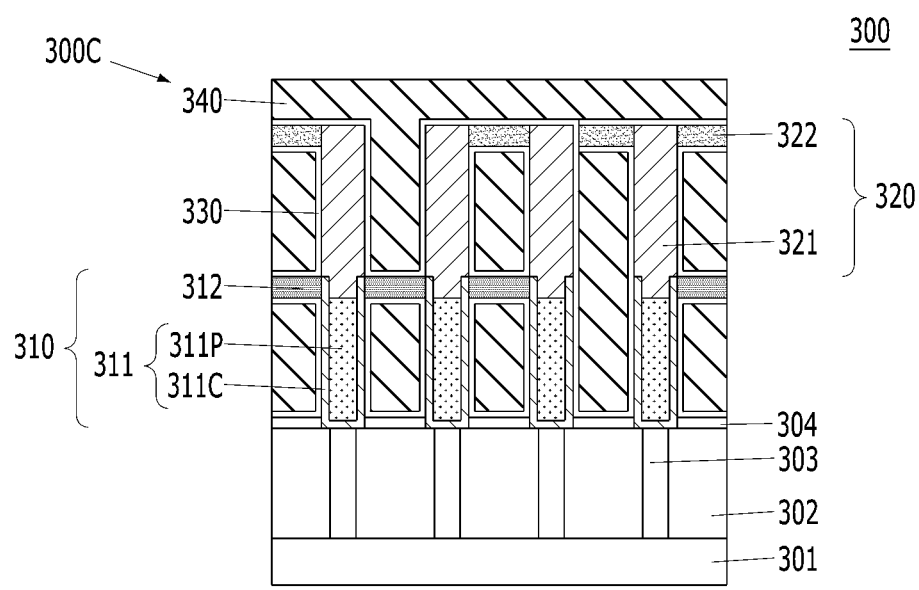
Figure 5:
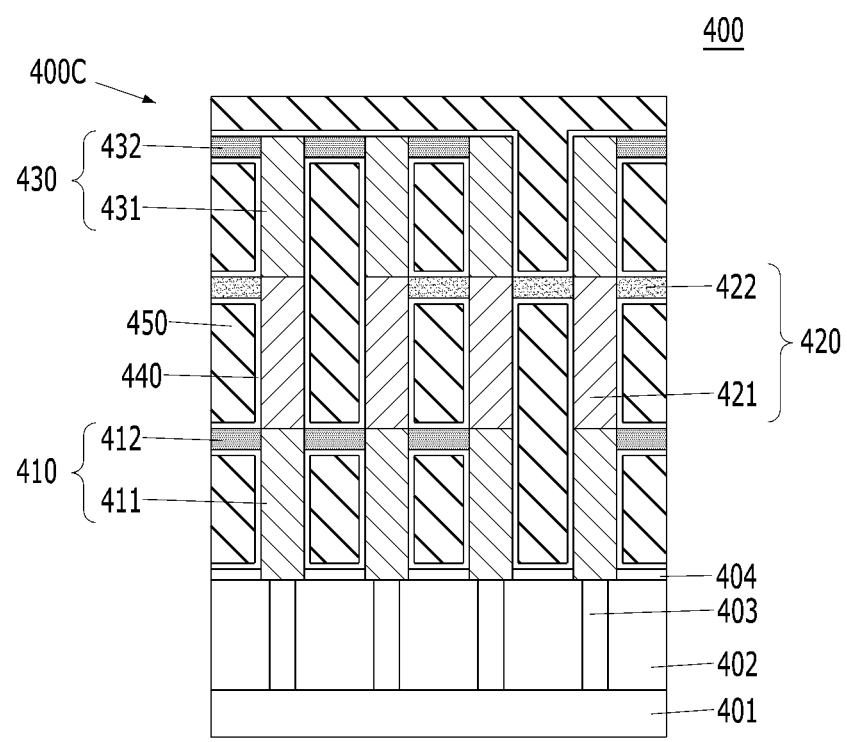

FIGS. 3 to 5 are cross-sectional views illustrating semiconductor devices in accordance with various embodiments of the present invention.

Referring to FIG. 3, a semiconductor device 200 may include a semiconductor substrate 201, a plurality of storage node contact plugs 203 formed on the semiconductor substrate 201 and a capacitor module 200C formed on the storage node contact plug 203.

The capacitor module 200C may include a lower capacitor module 210 and a upper capacitor module 220. The lower capacitor module 210 may include a plurality of lower bottom electrodes 211 and a lower supporter 212. The upper capacitor module 220 may include a plurality of upper bottom electrodes 221 and an upper supporter 222. The upper capacitor module 220 may be disposed on the lower capacitor module 210, and the lower capacitor module 210 and the upper capacitor module 220 may be vertically coupled to each other. The lower bottom electrodes 211 and the upper bottom electrodes 221 may be vertically coupled to each other. When seen from the top, the lower supporter 212 and the upper supporter 222 may have different shapes. The lower bottom electrodes 211 and the upper bottom electrodes 221 may be made of the same material or different materials.

The lower bottom electrodes 211 may have pillar shapes, and the upper bottom electrodes 221 may have cylinder shapes.

Referring to FIG. 4, a semiconductor device 300 may include a semiconductor substrate 301, a storage node contact plugs 303 on the semiconductor substrate 301 and a capacitor module 300C on the storage node contact plugs 303.

The capacitor module 300C may include a lower capacitor module 310 and a upper capacitor module 320. The capacitor module 300C may further include a dielectric layer 330 and a top electrode 340.

The lower capacitor module 310 may include a plurality of lower bottom electrodes 311 and a lower supporter 312. The upper capacitor module 320 may include a plurality of upper bottom electrodes 321 and an upper supporter 322. The upper capacitor module 320 may be disposed on the lower capacitor module 310, and the lower capacitor module 310 and the upper capacitor module 320 may be vertically coupled to each other. The lower bottom electrodes 311 and the upper bottom electrodes 321 may be vertically coupled to each other. When seen from the top, the lower supporter 312 and the upper supporter 322 may have different shapes. The lower bottom electrodes 311 and the upper bottom electrodes 321 may be made of the same material or different materials.

The lower bottom electrodes 311 may have pylinder shapes, and the upper bottom electrodes 321 may have pillar shapes. The pylinder shape refers to a structure in which a cylinder shape and a pillar shape are merged, and each of the lower bottom electrodes 311 may include a cylinder 311C and a pillar 311P. The pillar 311P may be formed inside the cylinder 311C. The top surface of the pillar 311P may be at a lower level than the top surface of the cylinder 311C. The outer wall of the cylinder 311C may be contacted with the lower supporter 312, and the pillar 311P may not be contacted with the lower supporter 312.

In some embodiments, the cylinder 311C and the pillar 311P, which are the same material, may be formed as one body. Accordingly, the top surface of the lower bottom electrode 311 may have a recessed pillar shape, and the upper bottom electrode 321 may have a pillar shape. Since the upper bottom electrode 321 is formed on the lower bottom electrode 311 whose top surface is recessed, the structural stability of the modular bottom electrode may be increased.

Referring to FIG. 5, a semiconductor device 400 may include a semiconductor substrate 401, a plurality of storage node contact plugs 403 formed on the semiconductor substrate 401 and a capacitor module 400C formed on the storage node contact plugs 403.

The capacitor module 400C may include a lower capacitor module 410, an upper capacitor module 430 and a middle capacitor module 420. The lower capacitor module 410, the middle capacitor module 420, and the upper capacitor module 430 may further include a dielectric layer 440 and a top electrode 450.

The lower capacitor module 410 may include a plurality of lower bottom electrodes 411 and a lower supporter 412. The upper capacitor module 430 may include a plurality of upper bottom electrodes 431 and an upper supporter 432. The middle capacitor module 420 may include a plurality of middle bottom electrodes 421 and an middle supporter 422.

The middle capacitor module 420 may be disposed on the lower capacitor module 410, and the upper capacitor module 430 may be disposed on the middle capacitor module 420. The lower capacitor module 410, the middle capacitor module 420 and the upper capacitor module 430 may be vertically coupled to one another. The lower bottom electrodes 411, the middle bottom electrodes 421 and the upper bottom electrodes 431 may be vertically coupled to one another. When seen from the top, the lower supporter 412 and the upper supporter 432 may have the same shape, and the middle supporter 422 may have a different shape from the lower supporter 412 and the upper supporter 432. In some embodiments, the lower supporter 412, the middle supporter 422 and the upper supporter 432 may have different shapes.

In some embodiments, as described in FIGS. 3 and 4, any one of the lower bottom electrodes 410, the middle bottom electrodes 421 and the upper bottom electrodes 431 may have any one of a pillar shape, a cylinder shape and a pylinder shape.

FIGS. 6A to 6E are cross-sectional views illustrating a method for fabricating a capacitor according to a comparative example.

Figure 6A:
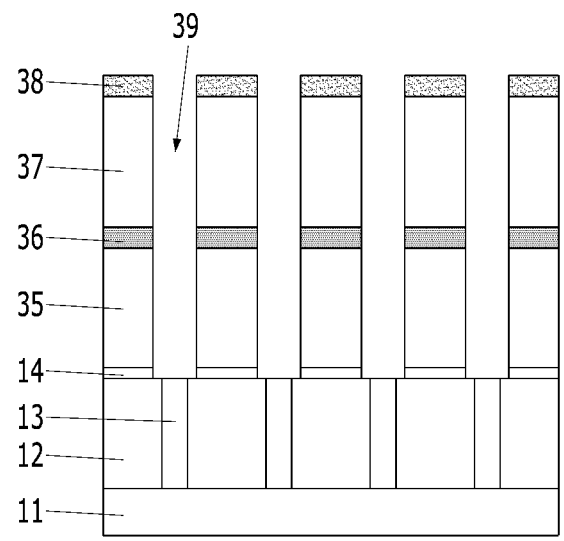
FIGS. 6A to 6E are cross-sectional views illustrating a method for fabricating a capacitor according to a comparative example.

Referring to FIG. 6A, an interlayer dielectric layer 12 may be formed on a semiconductor substrate 11. A plurality of storage node contact plugs 13 may be formed through the interlayer dielectric layer 12 to be spaced apart from each other at a regular interval along the first direction D1.

A mold structure may be formed on the storage node contact plugs 13 and the interlayer dielectric layer 12. The mold structure may include a stack of an etch stop layer 14, a first mold layer 35, a lower supporter layer 36, a second mold layer 37 and an upper supporter layer 38.

Subsequently, a plurality of openings 39 may be formed. The upper supporter layer 38, the second mold layer 37, the lower supporter layer 36 and the first mold layer 35 may be sequentially etched using a mask layer (not illustrated) as an etch barrier, in order to form the openings 39. The etch process for forming the openings 39 may be stopped at the etch stop layer 14.

According to the comparative example, the mold structure may be etched at one time in order to form the openings 39. Since the openings 39 have a high aspect ratio, the openings 39 may not be opened when the mold structure is etched.

Figure 6B:
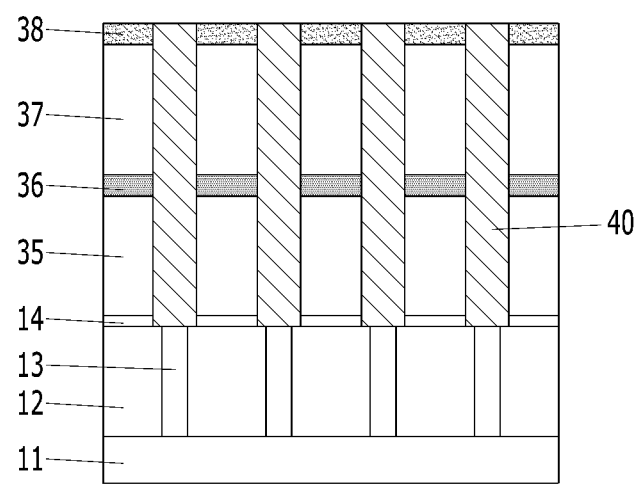

Referring to FIG. 6B, bottom electrodes 40 may be formed in each of the openings 39. The bottom electrodes 40 may fill the inside of the openings 39. The bottom electrodes 40 may have a pillar shape. In order to form the bottom electrodes 40 having the pillar shape, a conductive material may be deposited to gap-fill the opening 39 and then planarized.

According to the comparative example, since the bottom electrodes 40 having a high aspect ratio is formed at one time, bending of the bottom electrode 40s may occur. In the present embodiments, since the lower and upper bottom electrodes are formed for each module, bending of the bottom electrodes may be suppressed.

Figure 6C:
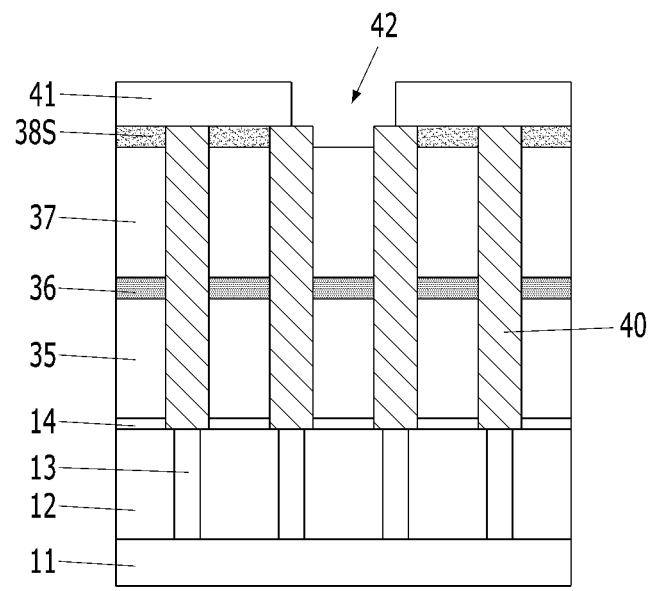

Referring to FIG. 6C, a supporter mask layer 41 may be formed and a portion of the upper supporter layer 38 may be etched using the supporter mask layer 41 as an etch barrier. An upper supporter opening 42 and an upper supporter 38S may be formed by the etching of the upper supporter layer 38.

Figure 6D:
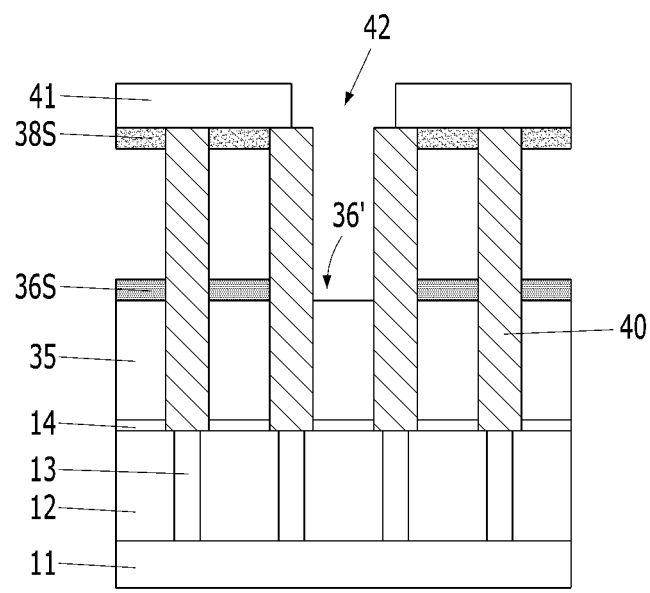

Referring to FIG. 6D, the second mold layer 37 may be removed, and then the lower supporter layer 36 may be etched. Accordingly, a lower supporter 36S and a lower supporter opening 36' may be formed. The lower and upper supporters 36S and 38S may be self-aligned, and the upper and lower supporter openings 42 and 36' may be self-aligned at right angles.

According to the comparative example as described above, the lower and upper supporters 36S and 38S may be formed by the etching of the single supporter mask layer 41.

In the present embodiments, the supporters may be formed for the respective modules using two supporter mask layers.

Figure 6E:
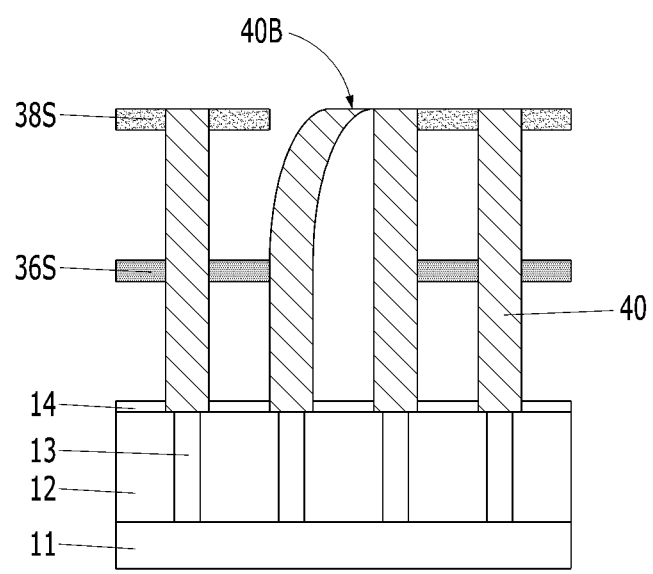

Referring to FIG. 6E, the supporter mask layer 41 may be removed. Subsequently, the first mold layer 35 may be removed.

According to the comparative example as described above, since the lower and upper supporters 36S and 38S are self-aligned, bending 40B of the bottom electrodes 40 may occur. In the embodiments of FIGS. 2A to 21, since the supporter opening 20 of the lower supporter 16S and the supporter opening 26 of the upper supporter 22S are disposed so as not to overlap each other, the bending of the first and second bottom electrodes 18 and 24 may be suppressed.

FIGS. 7A to 8B are diagrams illustrating semiconductor devices in accordance with various embodiments. FIGS. 7A to 8B illustrate modifications of a lower capacitor module 110 and a upper capacitor module 120.

Figure 7A:
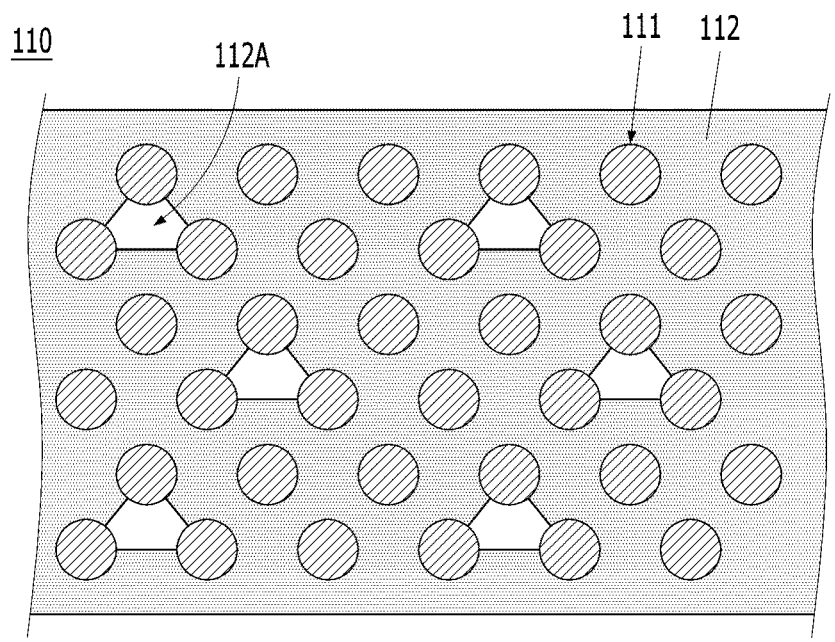
FIGS. 7A to 8B are diagrams illustrating semiconductor devices in accordance with embodiments.
Figure 7B:
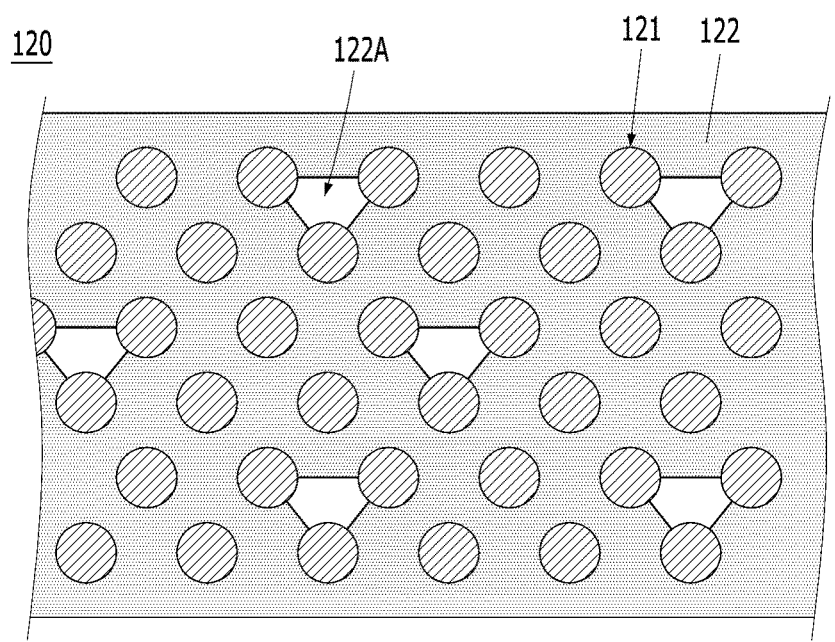

Referring to FIGS. 7A and 7B, the lower capacitor module 110 may include a plurality of lower bottom electrodes 111 and a lower supporter 112 supporting the lower bottom electrodes 111. The lower supporter 112 may include a plurality of lower supporter openings 112A. Each of the lower supporter openings 112A may have a shape to expose a space among three neighboring lower bottom electrodes 111. The upper capacitor module 120 may include a plurality of upper bottom electrodes 121 and an upper supporter 122 supporting the upper bottom electrodes 121. The upper supporter 122 may include a plurality of upper supporter openings 122A. Each of the upper supporter openings 122A may have a shape to expose a space among three neighboring upper bottom electrodes 121.

Figure 8A:
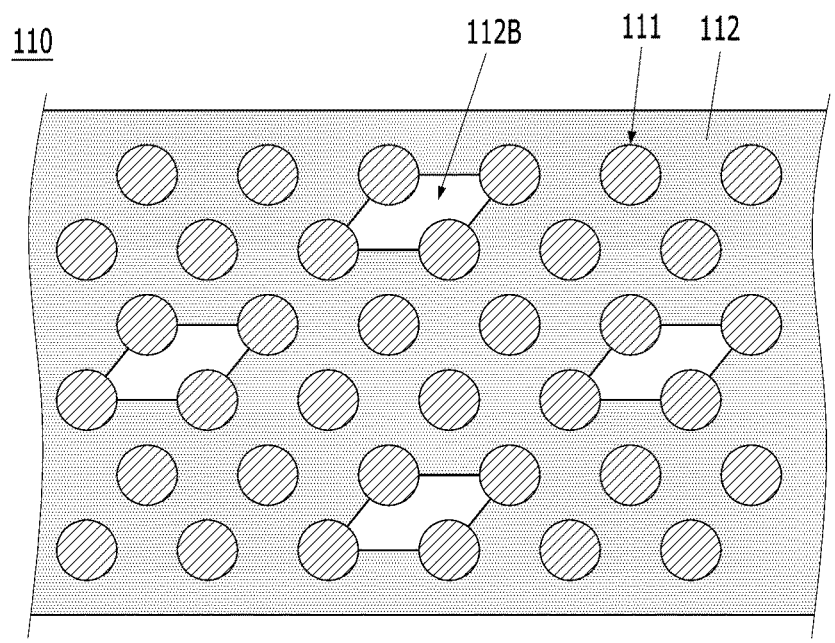
Figure 8B:
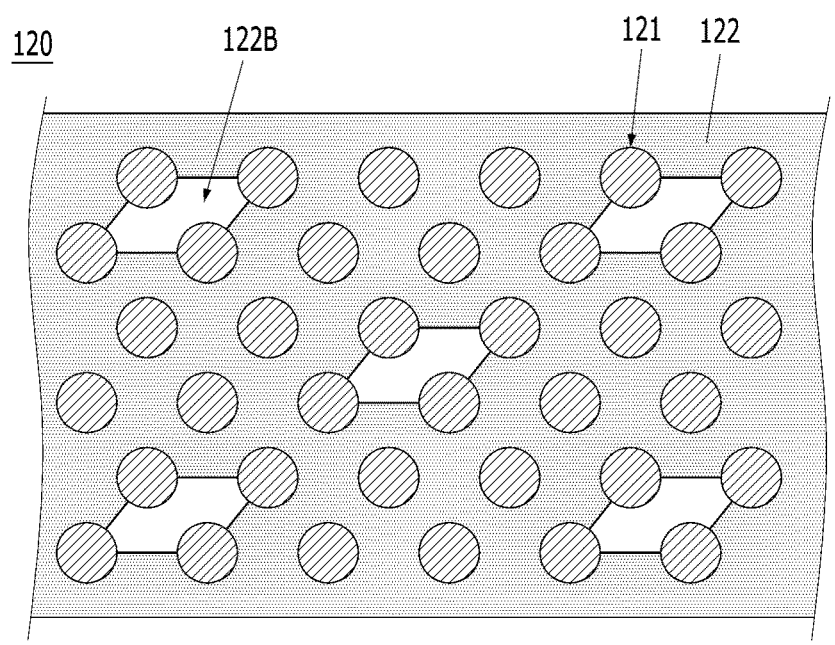

Referring to FIGS. 8A and 8B, the lower capacitor module 110 may include a plurality of lower bottom electrodes 111 and a lower supporter 112 supporting the lower bottom electrodes 111. The lower supporter 112 may include a plurality of lower supporter openings 112B. Each of the lower supporter openings 112B may have a shape to expose a space among four neighboring lower bottom electrodes 111. The upper capacitor module 120 may include a plurality of upper bottom electrodes 121 and an upper supporter 122 supporting the upper bottom electrodes 121. The upper supporter 122 may include a plurality of upper supporter openings 122B. Each of the upper supporter openings 122B may have a shape of exposing a space among four neighboring upper bottom electrodes 121.

In some embodiments, the capacitor module may be formed as described above on a modular basis wherein each of the lower supporter openings 112B may have a shape to expose a space among five or more neighboring lower bottom electrodes 111, and each of the upper supporter openings 122B may have a shape to expose a space among five or more neighboring upper bottom electrodes 121.

The capacitor module may have a multi-level structure, also referred to as a multi-module structure. The multi-level capacitor module may include a capacitor module including three or more modules.

Figure 9:
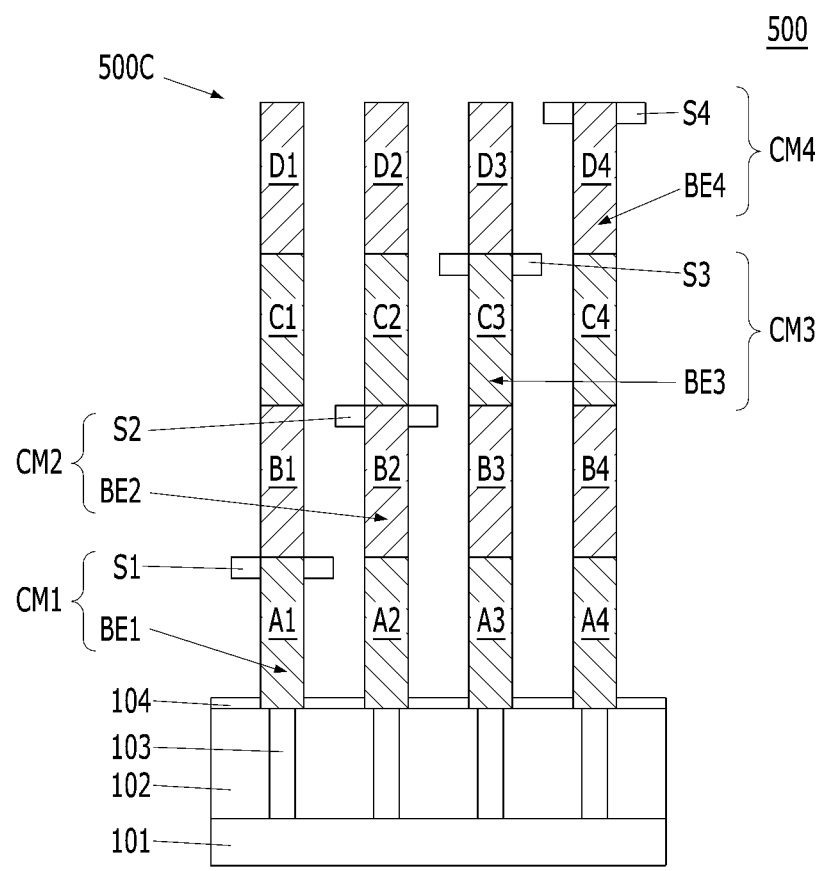
FIG. 9 is a cross-sectional view illustrating a semiconductor device in accordance with an embodiment of the present invention.

FIG. 9 is a cross-sectional view illustrating a semiconductor device 500 in accordance with an embodiment of the present invention.

Referring to FIG. 9, the semiconductor device 500 may include a capacitor module 500C. The capacitor module 500C may be a four-module capacitor module including a first capacitor module CM1, a second capacitor module CM2, a third capacitor module CM3 and a fourth capacitor module CM4.

The first capacitor module CM1 may include a plurality of first bottom electrodes BE1 and a first supporter S1 supporting the first bottom electrodes BE1. The second capacitor module CM2 may include a plurality of second bottom electrodes BE2 and a second supporter S2 supporting the second bottom electrodes BE2. The third capacitor module CM3 may include a plurality of third bottom electrodes BE3 and a third supporter S3 supporting the third bottom electrodes BE3. The fourth capacitor module CM4 may include a plurality of fourth bottom electrodes BE4 and a fourth supporter S4 supporting the fourth bottom electrodes BE4.

A vertical structure in which the first bottom electrodes BE1, the second bottom electrodes BE2, the third bottom electrodes BE3 and the fourth bottom electrodes BE4 are sequentially stacked may be a modular bottom electrode. One of the first to fourth bottom electrodes BE1 to BE4 in the modular bottom electrode may be a fully-supported bottom electrode, and the other bottom electrodes may be partially-supported bottom electrodes.

Each of the first to fourth supporters S1 to S4 may include a plurality of supporter openings. The respective supporter openings of the first to fourth supporters S1 to S4 may be any one of the supporter openings described with reference to FIGS. 1A to 8B. The first to fourth supporters S1 to S4 may include portions that fully supporter the bottom electrodes BE1 to BE4 and portions that partially supporter the bottom electrodes BE1 to BE4, in the capacitor modules CM1 to CM4, respectively.

FIGS. 10A to 10D are diagrams illustrating a method for fabricating the semiconductor device 500 shown in FIG. 9.

Figure 10A:
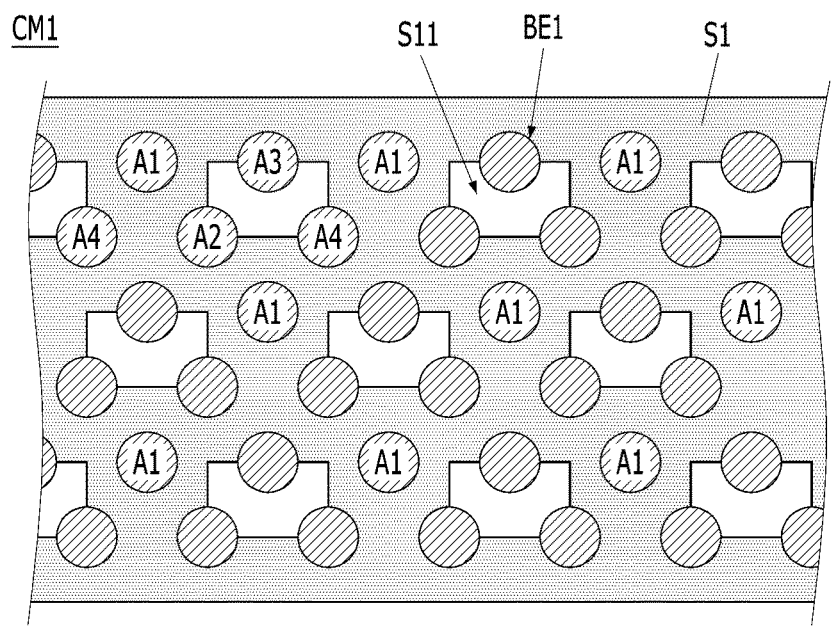
FIGS. 10A to 10D are diagrams illustrating a method for fabricating the semiconductor device shown in FIG. 9.

Referring to FIG. 10A, the first capacitor module CM1 may include the plurality of first bottom electrodes BE1 and the first supporter S1 supporting the first bottom electrodes BE1. The first supporter S1 may include a plurality of first supporter openings S11. Each of the first supporter openings S11 may have a shape to expose a space among three neighboring first bottom electrodes BE1.

Three first bottom electrodes A2, A3 and A4 of the first bottom electrodes BE1 may be partially supported by the first supporter S1, and one first bottom electrode A1 may be fully supported by the first supporter S1.

Figure 10B:
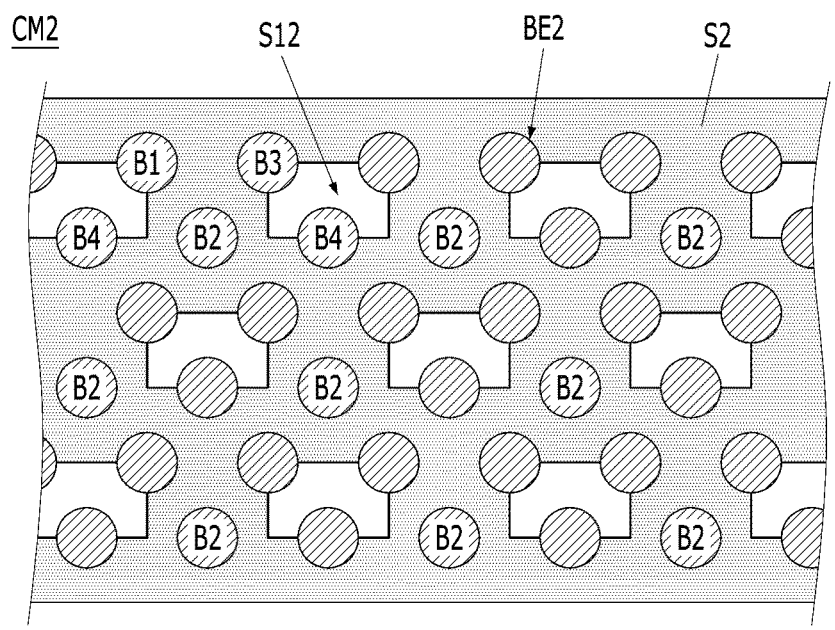

The second capacitor module CM2 may be formed on the first capacitor module CM1. Referring to FIG. 10B, the second capacitor module CM2 may include the plurality of second bottom electrodes BE2 and the second supporter S2 supporting the second bottom electrodes BE2. The second supporter S2 may include a plurality of second supporter openings S12. Each of the second supporter openings S12 may have a shape to expose a space among three neighboring second bottom electrodes BE2.

Three second bottom electrodes B1, B3 and B4 of the second bottom electrodes BE2 may be partially supported by the second supporter S2, and one second bottom electrode B2 may be fully supported by the second supporter S2.

Figure 10C:
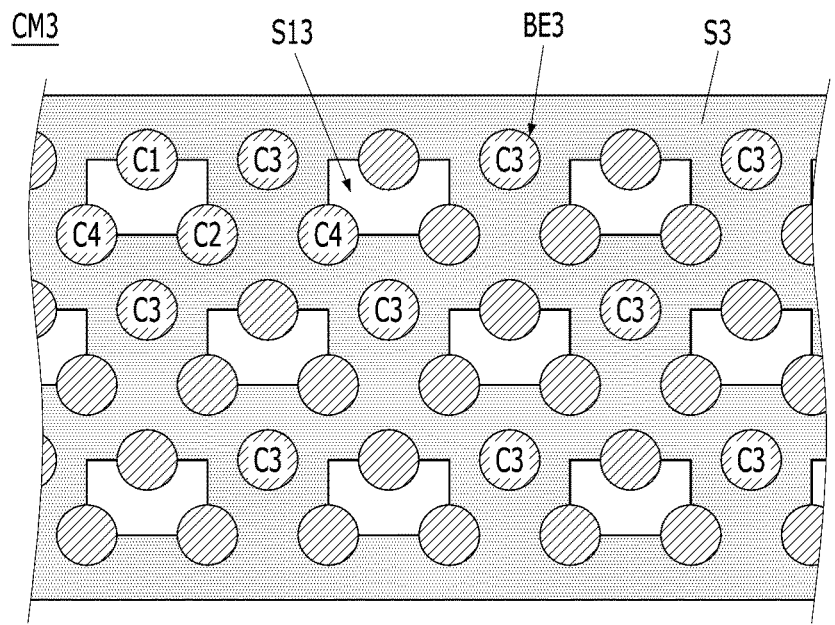

The third capacitor module CM3 may be formed on the second capacitor module CM2. Referring to FIG. 10C, the third capacitor module CM3 may include the plurality of third bottom electrodes BE3 and the third supporter S3 supporting the third bottom electrodes BE3. The third supporter S3 may include a plurality of third supporter openings S13. Each of the third supporter openings S13 may have a shape to expose a space among three neighboring third bottom electrodes BE3.

Three third bottom electrodes C1, C2 and C4 of the third bottom electrodes BE3 may be partially supported by the third supporter S3, and one third bottom electrode C3 may be fully supported by the third supporter S3.

Figure 10D:
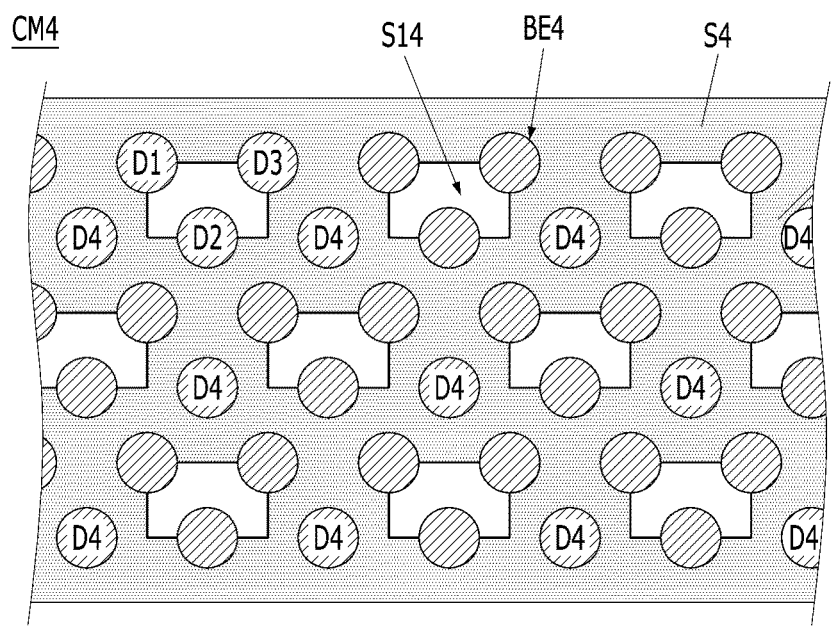

The fourth capacitor module CM4 may be formed on the third capacitor module CM3. Referring to FIG. 10D, the fourth capacitor module CM4 may include the plurality of fourth bottom electrodes BE4 and the fourth supporter S4 supporting the fourth bottom electrodes BE4. The fourth supporter S4 may include a plurality of fourth supporter openings S14. Each of the fourth supporter openings S14 may have a shape to expose a space among three neighboring fourth bottom electrodes BE4.

Three fourth bottom electrodes D1, D2 and D3 of the fourth bottom electrodes BE4 may be partially supported by the fourth supporter S4, and one fourth bottom electrode D4 may be fully supported by the fourth supporter S4.

After the fourth capacitor module CM4 is formed, a dielectric layer 27 and a top electrode 28 may be formed as shown in FIG. 2J. The first to fourth capacitor modules CM1 to CM4 may share the dielectric layer 27 and the top electrode 28.

In accordance with the present embodiments, a capacitor having a modular structure including two or more modules may be formed and which has a high aspect ratio. Because of its modular construction and also because of the method of manufacturing of the modular structure may be formed bending of the bottom electrode array and the individual bottom electrodes can be reduced or prevented altogether. Also, high aspect ratios and increased surface area of the bottom electrode array may be obtained. Thus, the characteristics and yield of the capacitor may be improved substantially.

In accordance with the present embodiments, the capacitance of the capacitor may be increased by increasing the open area of the supporter opening.

While the present invention has been described with respect to specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A capacitor comprising:
a plurality of lower bottom electrodes;
a lower supporter supporting the lower bottom electrodes and including a plurality of lower supporter openings;
upper bottom electrodes formed on the lower bottom electrodes, respectively; and
an upper supporter supporting the upper bottom electrodes and including a plurality of upper supporter openings,
wherein the lower supporter openings and the upper supporter openings do not vertically overlap each other.

2. The capacitor of claim 1, wherein the lower bottom electrodes include:
fully-supported lower bottom electrodes which are fully surrounded by the lower supporter; and
partially-supported lower bottom electrodes which are partially surrounded by the lower supporter.

3. The capacitor of claim 2, wherein the upper bottom electrodes include:
fully-supported upper bottom electrodes which are fully surrounded by the upper supporter; and
partially-supported upper bottom electrodes which are partially surrounded by the upper supporter.

4. The capacitor of claim 3, wherein the fully-supported lower bottom electrodes and the partially-supported upper bottom electrodes are vertically contacted with each other.

5. The capacitor of claim 3, wherein the partially-supported lower bottom electrodes and the fully-supported upper bottom electrodes contact each other vertically.

6. The capacitor of claim 1, wherein the lower supporter and the upper supporter include the same material.

7. The capacitor of claim 1, wherein each of the lower and upper bottom electrodes has a pillar shape.

8. The capacitor of claim 1, wherein each of the lower bottom electrodes has a pillar shape, and each of the upper bottom electrodes has a cylinder shape.

9. The capacitor of claim 1, wherein each of the lower bottom electrodes has a cylinder shape, and each of the upper bottom electrodes has a pillar shape.

* * * * *